US012616035B2

(12) United States Patent
Minaminaka et al.

(10) Patent No.: US 12,616,035 B2
(45) Date of Patent: Apr. 28, 2026

(54) SEMICONDUCTOR DEVICE AND MANUFACTURING METHOD THEREOF

(71) Applicant: Kioxia Corporation, Tokyo (JP)

(72) Inventors: Makoto Minaminaka, Suzuka Mie (JP); Masahiko Takeuchi, Kuwana Mie (JP)

(73) Assignee: Kioxia Corporation, Tokyo (JP)

( * ) Notice: Subject to any disclaimer, the term of this patent is extended or adjusted under 35 U.S.C. 154(b) by 577 days.

(21) Appl. No.: 18/078,847

(22) Filed: Dec. 9, 2022

(65) Prior Publication Data

US 2023/0395522 A1 Dec. 7, 2023

(30) Foreign Application Priority Data

Jun. 3, 2022 (JP) ................................. 2022-090983

(51) Int. Cl.
*H01L 23/544* (2006.01)
*H01L 23/552* (2006.01)
*H01L 25/065* (2023.01)

(52) U.S. Cl.
CPC .......... *H01L 23/544* (2013.01); *H01L 23/552* (2013.01); *H01L 25/0657* (2013.01); *H01L 2223/54413* (2013.01); *H01L 2225/06506* (2013.01); *H01L 2225/06537* (2013.01); *H01L 2225/06562* (2013.01); *H01L 2225/06586* (2013.01)

(58) Field of Classification Search
None
See application file for complete search history.

(56) References Cited

U.S. PATENT DOCUMENTS

| | | | |
|---|---|---|---|
| 5,510,163 A | 4/1996 | Sullivan et al. | |
| 6,578,764 B1 * | 6/2003 | Hiraishi | ............... H01L 23/544 |
| | | | 235/494 |
| 9,805,224 B2 | 10/2017 | Deak et al. | |
| 2014/0284775 A1 * | 9/2014 | Nomura | .............. H01L 25/0657 |
| | | | 257/659 |
| 2017/0186696 A1 * | 6/2017 | Scanlan | .................. H01L 24/97 |
| 2017/0267013 A1 * | 9/2017 | Staub | .................. B42D 25/328 |
| 2020/0391419 A1 | 12/2020 | Suzuki et al. | |

FOREIGN PATENT DOCUMENTS

| | | |
|---|---|---|
| JP | 2010076369 A | 4/2010 |
| JP | 2020124858 A | 8/2020 |
| JP | 6932507 B2 | 8/2021 |

* cited by examiner

*Primary Examiner* — Khaja Ahmad
(74) *Attorney, Agent, or Firm* — Holtz, Holtz & Volek PC

(57) ABSTRACT

A semiconductor device according to the present embodiment includes a resin layer, ink, and a film. The ink is provided on an upper surface of the resin layer. The film coats the resin layer and the ink. Surface roughnesses of the film are different between in a first region where the ink is provided and in a second region where the ink is not provided.

19 Claims, 13 Drawing Sheets

F91

91

F100

F91

100

91

SEMICONDUCTOR DEVICE AND MANUFACTURING METHOD THEREOF

CROSS REFERENCE TO RELATED APPLICATIONS

This application is based upon and claims the benefit of priority from the prior Japanese Patent Application No. 2022-090983, filed on Jun. 3, 2022, the entire contents of which are incorporated herein by reference.

FIELD

The embodiments of the present invention relate to a semiconductor device and a manufacturing method thereof.

BACKGROUND

A logo, a product name, the country of manufacture, information codes, and the like are sometimes presented on the outer surface of a semiconductor device. An example of the information codes is a bar code. Laser marking and ink marking are used for the presentation, for example.

An ink mark is printed on a shield film of the semiconductor package, for example, by an inkjet printer. Nevertheless, there is a possibility that ink disappears or printed matters are faded due to an organic solvent, physical wearing, or the like.

DETAILED DESCRIPTION

Figure 1:
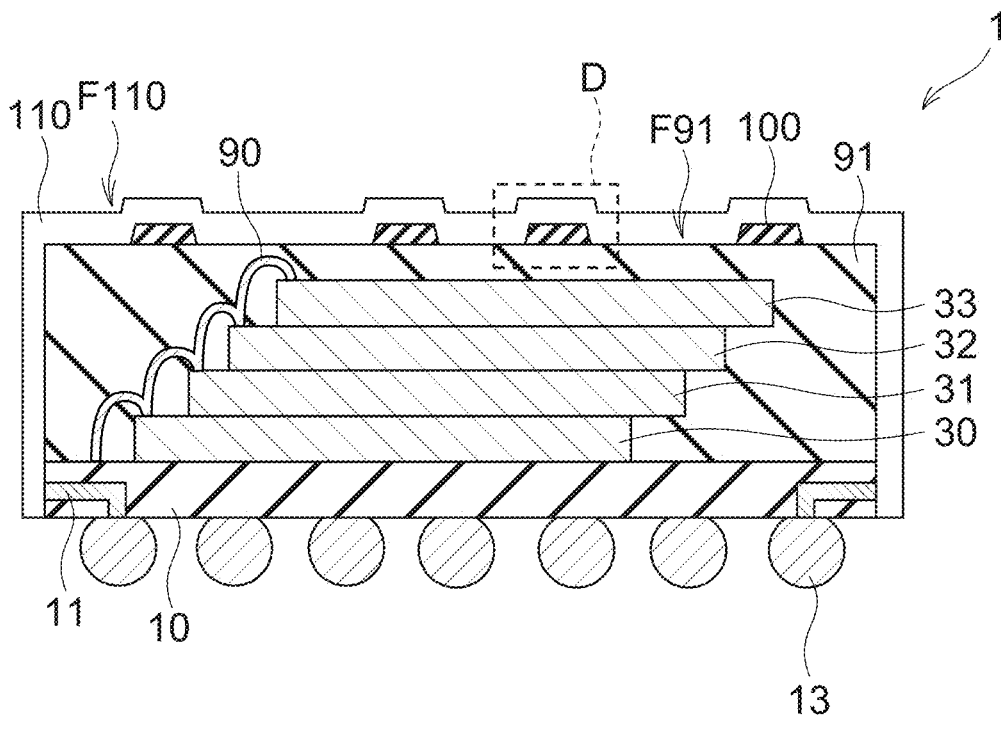
FIG. 1 is a cross sectional view showing an example of a configuration of a semiconductor device according to a first embodiment.

Embodiments will now be explained with reference to the accompanying drawings. The present invention is not limited to the embodiments. In the embodiments, "an upper direction" or "a lower direction" refers to a relative direction when a direction perpendicular to a surface of a semiconductor substrate on which semiconductor elements are provided is assumed as "an upper direction". Therefore, the term "upper direction" or "lower direction" occasionally differs from an upper direction or a lower direction based on a gravitational acceleration direction. It should be noted that the drawings are schematic or conceptual, and the relationship between the thickness and the width in each element and the ratio among the dimensions of elements do not necessarily match the actual ones. Even if two or more drawings show the same portion, the dimensions and the ratio of the portion may differ in each drawing. In the present specification and the drawings, elements identical to those described in the foregoing drawings are denoted by like reference characters and detailed explanations thereof are omitted as appropriate.

A semiconductor device according to the present embodiment includes a resin layer, ink, and a film. The ink is provided on an upper surface of the resin layer. The film coats the resin layer and the ink. The surface roughnesses of the film are different between in a first region where the ink is provided and in a second region where the ink is not provided.

First Embodiment

FIG. 1 is a cross sectional view showing an example of a configuration of a semiconductor device 1 according to a first embodiment. The semiconductor device 1 includes a wiring substrate 10, semiconductor chips 30 to 33, bonding wires 90, a sealing resin 91, ink 100, and a film 110. An example of the semiconductor device 1 is a package of a NAND flash memory.

The wiring substrate 10 may be a printed circuit board or an interposer including wiring layers (not shown) and insulating layers (not shown). For each wiring layer, a low resistance metal such as copper (Cu), nickel (Ni) or any alloy of these is used, for example. For each insulating layer, an insulating material such as glass epoxy resin is used, for example. The wiring substrate 10 may have a multilayer wiring structure configured by stacking a plurality of wiring layers and a plurality of insulating layers. The wiring substrate 10 may have through electrodes penetrating from its front surface to its back surface, like an interposer, for example.

The wiring substrate 10 has ground lines 11. Each ground line 11 electrically connects a metal bump 13 provided on a lower surface of the wiring substrate 10 to the film 110. Metal bumps 13 are provided for electrically connecting not-shown other components to the wiring substrate 10.

An example of the semiconductor chip 30 is a memory chip including a NAND flash memory. The semiconductor chip 30 has semiconductor elements (not shown) on its surface (upper surface). For example, the semiconductor elements may be a memory cell array and its peripheral circuit (CMOS circuit). The memory cell array may be a three-dimensional memory cell array having a plurality of memory cells three-dimensionally arranged. Moreover, onto the semiconductor chip 30, the semiconductor chip 31 is bonded via a bonding layer (not shown). Onto the semiconductor chip 31, the semiconductor chip 32 is bonded via a bonding layer. Onto the semiconductor chip 32, the semiconductor chip 33 is bonded via a bonding layer. For example, as with the semiconductor chip 30, the semiconductor chips 31 to 33 are memory chips including NAND flash memories. The semiconductor chips 30 to 33 may be the same memory chips. In the figure, the semiconductor chips 30 to 33 as four memory chips are stacked. Nevertheless, the number of stacking of semiconductor chips may be not more than three or not less than five.

The bonding wires 90 are connected to certain pads of the wiring substrate 10 and the semiconductor chips 30 to 33. For the connections with the bonding wires 90, the semiconductor chips 30 to 33 are stacked with displacements by the dimensions of the pads.

Furthermore, the sealing resin 91 seals the semiconductor chips 30 to 33, the bonding wires 90, and the like. By doing so, the semiconductor device 1 is configured as one semiconductor package by placing the plurality of semiconductor chips 30 to 33 on the wiring substrate 10.

The ink 100 is provided on a face F91 (upper surface) of the sealing resin 91. The ink 100 presents, for example, a logo, a product name, the country of manufacture, information codes, and the like (see FIG. 3A to FIG. 3C) as viewed from the upper direction within the view plane of FIG. 1. A bar code by way of example is included in the information codes. The ink 100 is printed, for example, using an inkjet printer. The ink 100 only has to be able to change from liquid or semisolid to solid.

The film 110 coats the sealing resin 91 and the ink 100. The film 110 is provided on the ink 100 and on the sealing resin 91 that is in the region where the ink 100 is not provided. As shown in FIG. 1, the ink 100 is not exposed but coated by the film 110. Thereby, the ink 100 can be protected. The film 110 is composed of a material for which at least one of hardness, abrasion resistance, chemical resistance, oil resistance, thermal resistance, and flame retardance is higher than that of the ink 100.

Moreover, the film 110 is preferably composed of a material having conductivity, such as a metal. By the film 110 being electrically connected to a ground line of a mount substrate via the ground lines 11 and the metal bumps 13, the film 110 functions as a shield film for shielding against electromagnetic waves.

Figure 2:
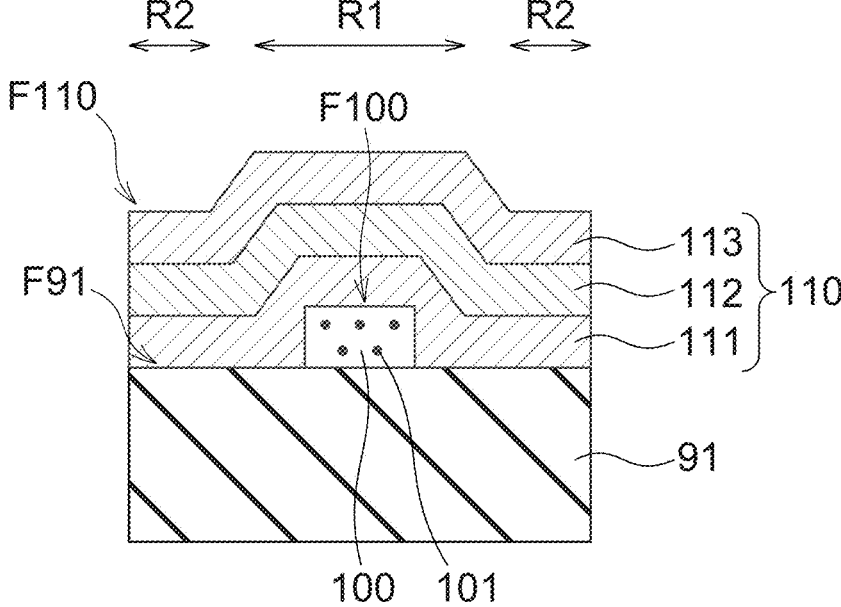
FIG. 2 is a cross sectional view showing an example of a configuration of ink and its periphery according to the first embodiment.

FIG. 2 is a cross sectional view showing an example of a configuration of the ink 100 and its periphery according to the first embodiment. FIG. 2 is an expanded view of the broken line frame D shown in FIG. 1.

The ink 100 is provided in a region R1. The ink 100 is not provided in a region R2.

The ink 100 contains a resin and pigment 101. An example of the resin is a UV-curing (ultraviolet-curing)

resin. A color of the ink 100 varies depending on the type of the pigment 101 for coloring thereof. Differences between types of the ink 100 are described later with reference to FIG. 3A to FIG. 3C.

The film 110 has a film 111, a film 112, and a film 113.

The film 111 has higher adhesion to the sealing resin 91 than the film 112. The film 111 is composed, for example, of stainless steel such as SUS304.

The film 112 has high conductivity. The film 112 is composed, for example, of copper (Cu).

The film 113 protects the film 112 against oxidation and the like. The film 113 is composed, for example, of stainless steel such as SUS304.

Next, differences between types of the ink 100 are described.

Figure 3A:
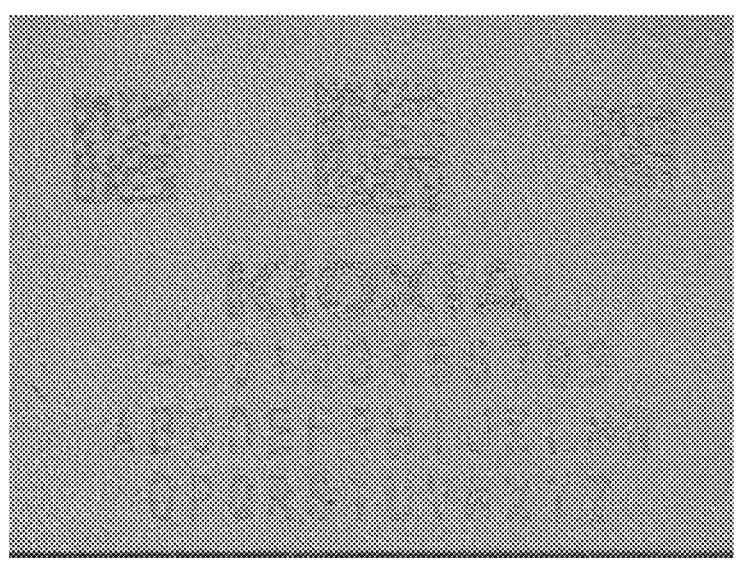
FIG. 3A is an appearance photograph showing an example of a face of a film according to the first embodiment.
Figure 3B:
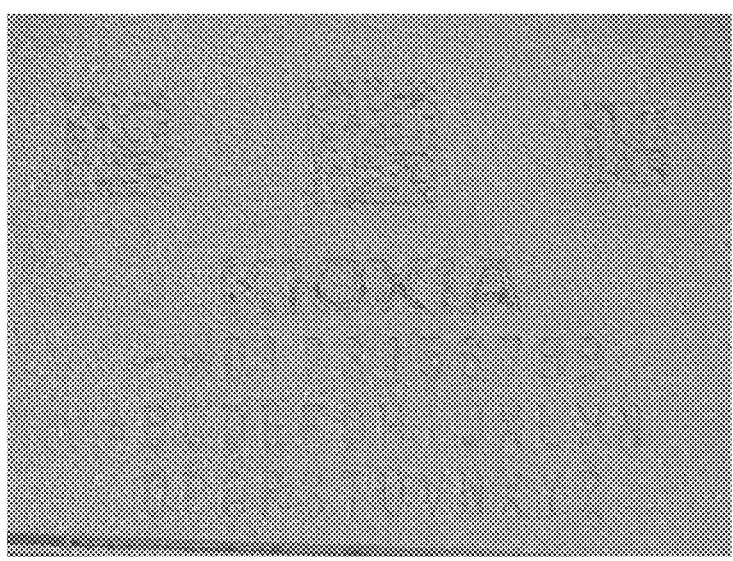
FIG. 3B is an appearance photograph showing an example of a face of a film according to the first embodiment.
Figure 3C:
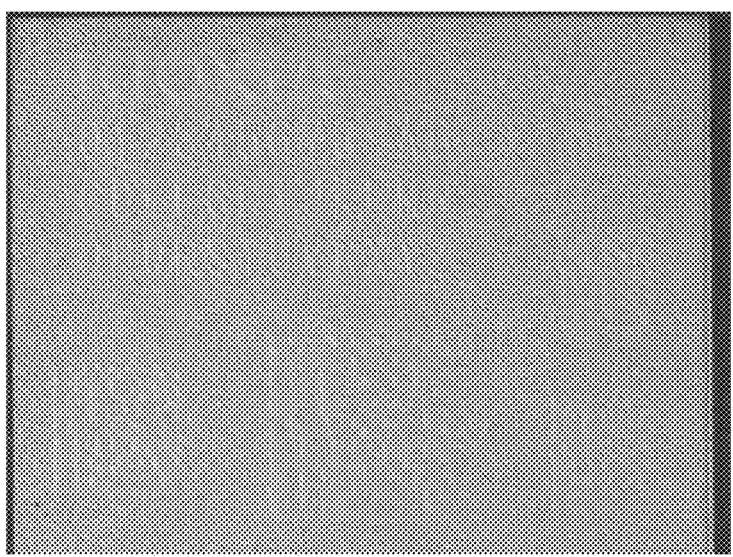
FIG. 3C is an appearance photograph showing an example of a face of a film according to the first embodiment.

FIG. 3A to FIG. 3C are appearance photographs showing examples of a face F110 of the film 110 according to the first embodiment. As shown in FIG. 3A to FIG. 3C, characters and bar codes are presented on the face F110 with the ink 100. An example of the bar codes is a two-dimensional bar code.

FIG. 3A to FIG. 3C show the photographs in the cases where the characters and the bar codes are printed using a black ink, a green ink, and a white ink, respectively. An example of the pigment 101 for the black ink is carbon black. An example of the pigment 101 for the white ink is titanium(IV) oxide.

Since the ink 100 is coated by the film 110, differences in color of the ink 100 do not appear on the face F110. Differences in appearance of the printed matters appear due to the degree of reflection of light on the face F110.

Among the examples shown in FIG. 3A to FIG. 3C, the visibility for the printed matters in the case where the black ink is used is highest. Moreover, the visibilities for the printed matters lower in the order of the black ink, the green ink, and the white ink.

In the examples shown in FIG. 3A to FIG. 3C, the face F110 in the region R2 where the ink 100 (characters and bar codes) is not provided is a rough surface and in a mat state.

In the example shown in FIG. 3C, the face F110 in the region R1 where the ink 100 (characters and bar codes) is provided is also in a mat state. Since both the regions R1 and R2 are in the mat state, the visibility for the printed matters is low.

In the examples shown in FIG. 3A and FIG. 3B, a surface of the face F110 in the region R1 where the ink 100 (characters and bar codes) is provided is relatively smooth. Light undergoes regular reflection on the region R1 to some extent, and the region R1 is viewed to be shiny. Since a surface of the face F110 in the region R2 other than the region R1 is a rough surface, light undergoes diffused reflection on the region R2. The region R2 as a background is viewed to be dark, the region R1 as the portion of the printed matters is viewed to be bright, and a brightness difference (gloss difference) between the region R1 and the region R2 is large. Accordingly, the visibility for the printed matters is high.

Details of surface states are described later with reference to FIGS. 5A to 5C and FIG. 6.

Figure 4A:
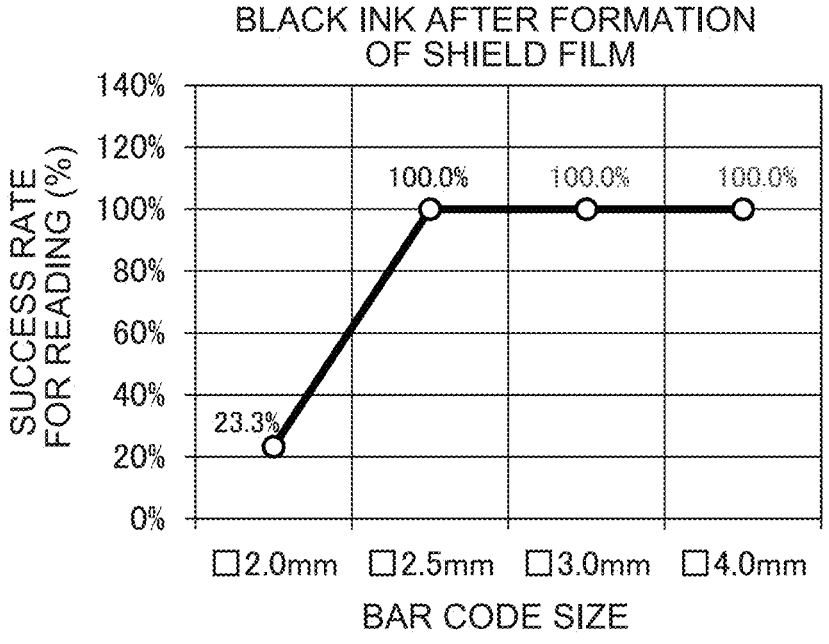
FIG. 4A is a graph showing an example of a success rate of reading a bar code according to the first embodiment.
Figure 4B:
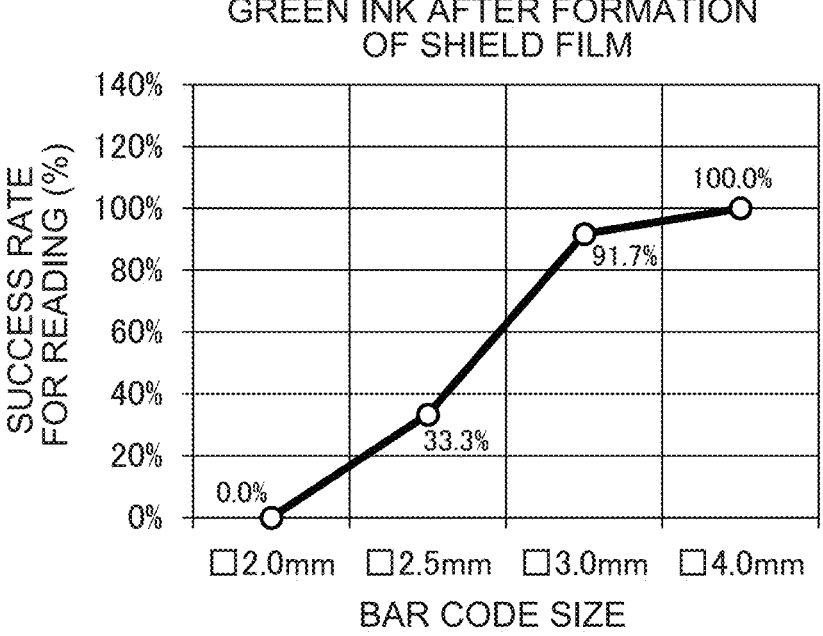
FIG. 4B is a graph showing an example of a success rate of reading a bar code according to the first embodiment.
Figure 4C:
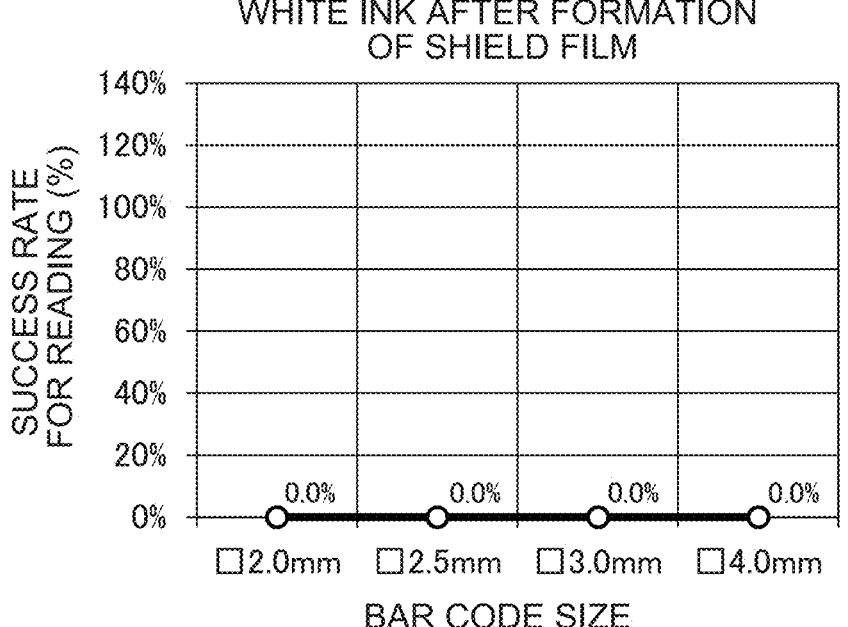
FIG. 4C is a graph showing an example of a success rate of reading a bar code according to the first embodiment.

FIG. 4A to FIG. 4C are graphs showing examples of a success rate of reading a bar code according to the first embodiment. The ordinates of each graph represent the success rate of reading the bar code. The abscissas of the graph represent a bar code size. In order to evaluate reading ability for the bar code, success rates of reading are measured for a plurality of bar code sizes of 2.0 mm, 2.5 mm, 3.0 mm, and 4.0 mm. The success rates of reading the bar code are the measurement results after formation of the film 110.

FIG. 4A to FIG. 4C show the graphs in the cases where characters and bar codes are printed using the black ink, the green ink, and the white ink, respectively.

The success rate of reading the bar code is measured using a bar code reader. For example, the bar code reader converts an image captured by a built-in camera into a binarized image of white and black with an inner processor, and reads the bar code based on the binarized image.

As shown in FIG. 4A, when the black ink is used as the ink 100, the success rate of reading becomes 100% at 2.5 mm or more of bar code size.

As shown in FIG. 4B, when the green ink is used as the ink 100, the success rate of reading becomes 100% at 4.0 mm of bar code size.

As shown in FIG. 4C, when the white ink is used as the ink 100, the success rate of reading is 0% at all the bar code sizes of 2.0 mm to 4.0 mm.

For any of the colors of the ink 100, the larger the bar code size is, the higher the success rate of reading is. The success rate of reading in the case where the black ink is used is highest in comparison of those at the same bar code size. Moreover, the success rates of reading lower in the order of the black ink, the green ink, and white ink. This tendency in the success rates of reading is the same as the tendency in the visibilities for the printed matters.

Next, differences between the surface states of the face F110 depending on the type of the ink 100 are described.

Figure 5A:
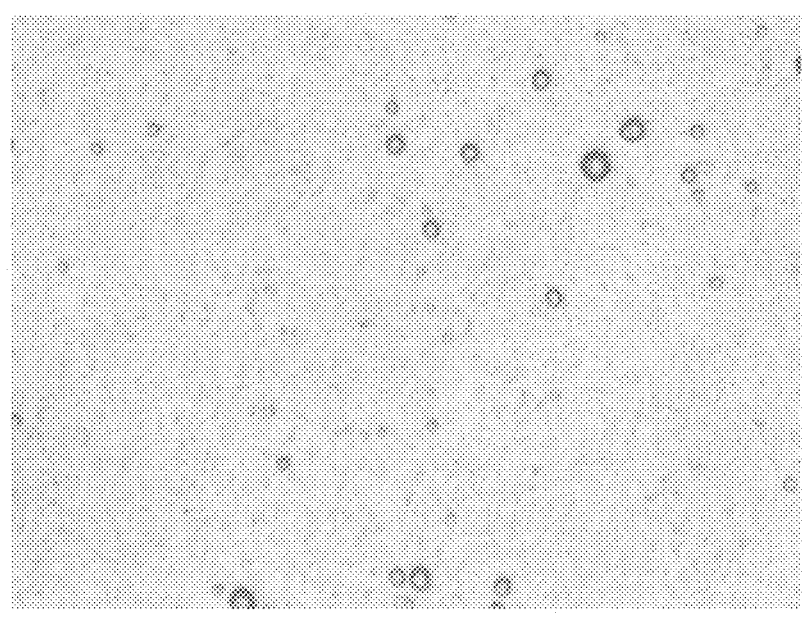
FIG. 5A is an enlarged photograph showing an example of a face in a region where the ink is provided, according to the first embodiment.
Figure 5B:
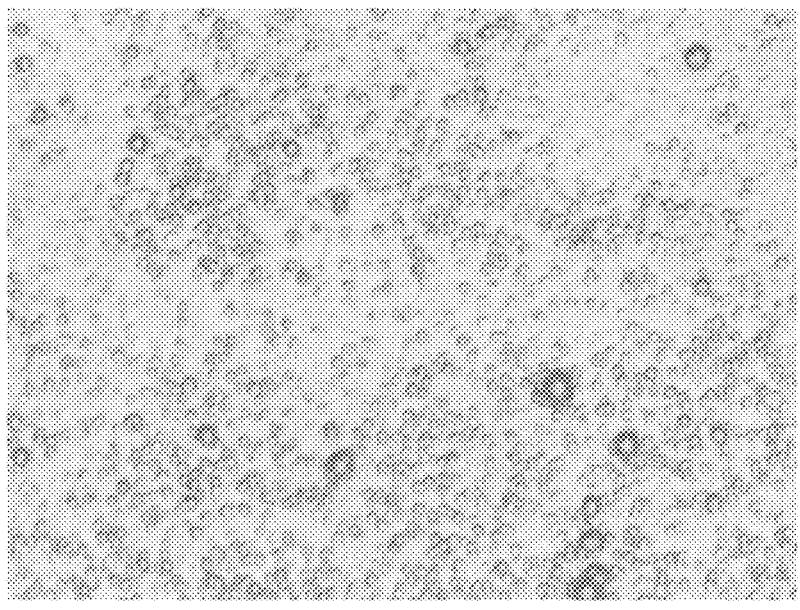
FIG. 5B is an enlarged photograph showing an example of a face in a region where the ink is provided, according to the first embodiment.
Figure 5C:
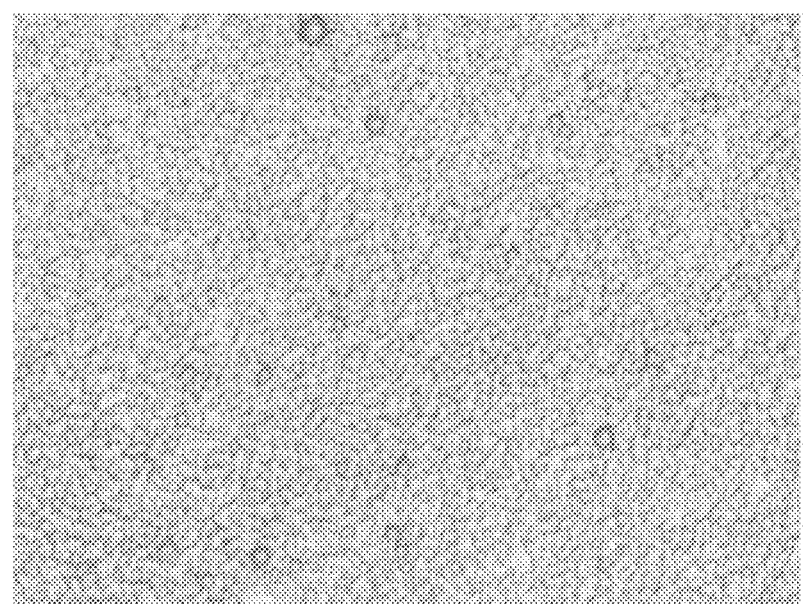
FIG. 5C is an enlarged photograph showing an example of a face in a region where the ink is provided, according to the first embodiment.

FIG. 5A to FIG. 5C are enlarged photographs showing examples of the face F110 in the region R1 where the ink 100 is provided, according to the first embodiment.

FIG. 5A to FIG. 5C shows the photographs in the cases where the characters and the bar codes are printed using the black ink, the green ink, and the white ink, respectively.

Reflection characteristics of the face F110 are affected by the surface state of the face F110. More in detail, the reflection characteristics of the face F110 are affected by the surface roughness of the face F110. The surface roughness of the face F110 is possibly affected, for example, by a particle size (measurement) and a density (concentration) of the pigment 101.

The particle size of the pigment 101 for the black ink is relatively small. As shown in FIG. 5A, roughness caused by the pigment 101 cannot be clearly recognized, and the face F110 in the region R1 is relatively smooth.

The particle size of the pigment 101 for the green ink is comparable with the particle size of the pigment 101 for the white ink mentioned later. Nevertheless, the concentration of the pigment 101 for the green ink is lower than the concentration of the pigment 101 for the white ink. As shown in FIG. 5B, the face F110 in the region R1 includes both of a smooth part which is relatively smooth and a roughness part (pimples) which is a rough surface.

The particle size of the pigment 101 for the white ink is relatively large. The concentration of the pigment 101 for the white ink is relatively high. Accordingly, as shown in FIG. 5C, there is roughness caused by the pigment 101 on the face F110 in the region R1, and the face F110 in the region R1 is in the mat state.

Figure 6:
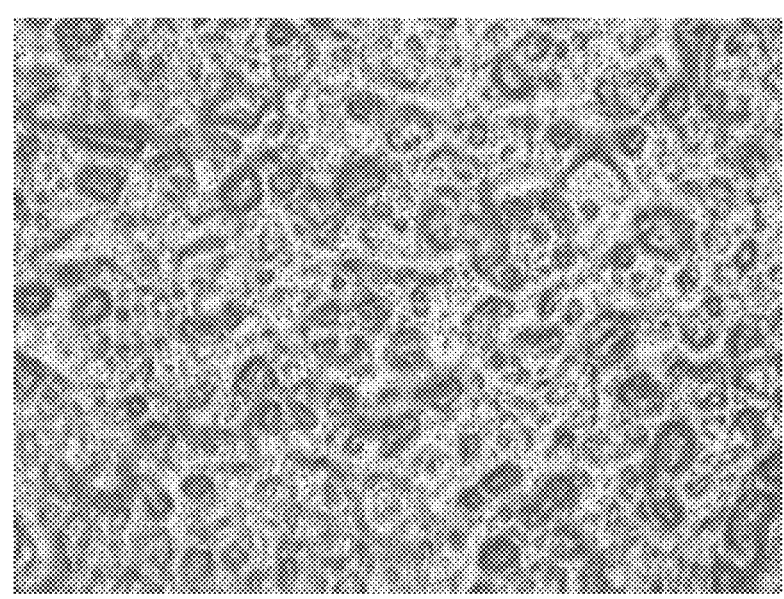
FIG. 6 is an enlarged photograph showing an example of a face in a region where the ink is not provided, according to the first embodiment.

FIG. 6 is an enlarged photograph showing an example of the face F110 in the region R2 where the ink 100 is not provided, according to the first embodiment.

As shown in FIG. 6, the face F110 in the region R2 is a rough surface and in the mat state. As described later with reference to FIG. 8A, this is because an outer surface of the sealing resin 91 is a rough surface. It is noted that the outer surface includes the upper surface (face F91) and a lateral surface.

Figure 7:
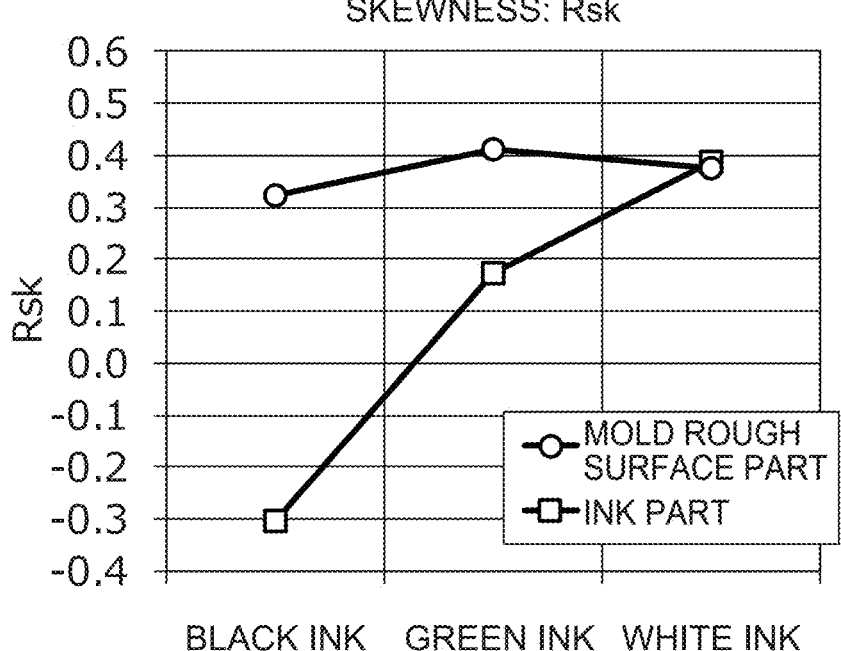
FIG. 7 is a graph showing an example of measurement results of a skewness in a face of the film according to the first embodiment.

FIG. 7 is a graph showing an example of measurement results of a skewness in the face F110 of the film 110 according to the first embodiment. The abscissas of the graph represent the type of the ink. The ordinates of the graph represent a skewness ("Rsk"). The skewness is one of roughness parameters.

A measurement scheme for the skewness is a laser scheme (noncontact). The skewness shown in FIG. 7 was measured based on the standards disclosed in JIS B0601:2001 (ISO 4287:1997). Measurement places for the skewness are in an ink part and a mold rough surface part on the face F110. Namely, the skewness is measured after formation of the film 110. The ink part corresponds to the region R1 where the ink 100 is provided. The mold rough surface part corresponds to the region R2 where the ink 100 is not provided.

The surface roughness may vary depending on measurement positions. Accordingly, each skewness shown in FIG. 7 is the average value among a plurality of measurement positions, for example. The skewness shown in FIG. 7 is the average value among any ten positions.

The skewness of the face F110 in the mold rough surface part is in a range of about 0.3 to about 0.4, and is approximately constant regardless of the type of the ink 100. On the other hand, the skewness of the face F110 in the ink part varies in a range of about −0.3 to about 0.4 depending on the type of the ink 100.

When the black ink is used as the ink 100, a difference in skewness of the face F110 between the mold rough surface part and the ink part is about 0.6. When the green ink is used as the ink 100, the difference in skewness of the face F110 between the mold rough surface part and the ink part is about 0.2. When the white ink is used as the ink 100, the difference in skewness of the face F110 between the mold rough surface part and the ink part is not more than about 0.05.

As shown in FIG. 3A to FIG. 3C, FIG. 4A to FIG. 4C, and FIG. 7, the larger the difference in skewness of the face F110 is, the higher the visibility or the success rate of reading is. Namely, there is seen a strong correlation between the difference in skewness and the visibility or the success rate of reading. The difference in skewness of the film 110 between in the region R1 where the ink 100 is provided and in the region R2 where the ink 100 is not provided is preferably not less than 0.2. The difference is preferable to be larger. The difference is still preferably 0.3 to 0.6, and the difference is further preferably not less than 0.6. In the first embodiment, the skewness of the film 110 in the region R1 is preferably lower than the skewness of the film 110 in the region R2 by not less than 0.2, still preferably lower by 0.3 to 0.6, further preferably lower by not less than 0.6. This can improve the visibility for printed matters or the reading ability for bar codes.

Next, a formation method of the ink 100 and the film 110 is described.

Figures 8A, 8B:
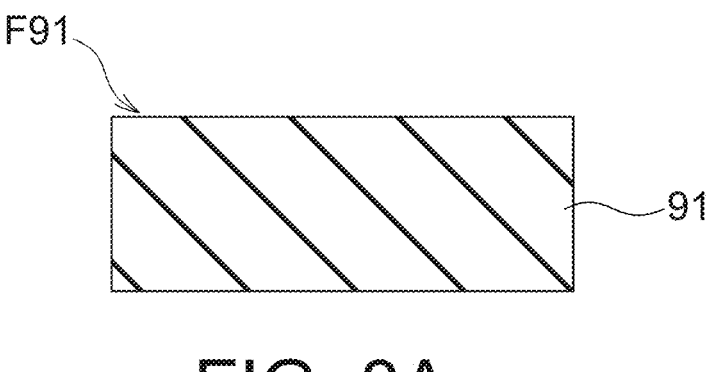
FIG. 8A is a cross sectional view showing an example of a manufacturing method of a semiconductor device according to the first embodiment.
FIG. 8B is a cross sectional view showing an example of the manufacturing method of a semiconductor device, succeedingly from FIG. 8A.

FIG. 8A and FIG. 8B are cross sectional views showing an example of a manufacturing method of the semiconductor device 1 according to the first embodiment.

First, the semiconductor chips 30 to 33 are stacked on the wiring substrate 10, and the bonding wires 90 electrically connecting the wiring substrate 10 to the semiconductor chips 30 to 33 are formed. After that, as shown in FIG. 8A, the sealing resin 91 coating the semiconductor chips 30 to 33 and the bonding wires 90 (see FIG. 1) is formed.

The face F91 of the sealing resin 91 is formed to be a rough surface (mat). There is a case where a surface state of the face F91 is affected, for example, by a surface state of a release film provided between the sealing resin 91 and a mold during its formation. For example, a release film a surface of which is a rough surface is used, and a pattern of the rough surface of the release film is transferred onto the face F91. Furthermore, there is also a case where the surface state of the face F91 is affected by types of filler and resin in the sealing resin 91, and the like, as well as the release film.

Furthermore, in order to improve adhesion between the sealing resin 91 and the ink 100, $O_2$ plasma processing may be performed on the sealing resin 91 before formation of the ink 100.

Next, as shown in FIG. 8B, the ink 100 is provided on an upper surface (face F91) of the sealing resin 91. The ink 100 is formed, for example, by printing a logo, characters, information codes, and the like by an inkjet printer. The ink 100 only has to be able to change from liquid or semisolid to solid. For example, the ink 100 is temporarily hardened with ultraviolet rays, and after that, hardened with heat.

Next, the film 110 coating the sealing resin 91 and the ink 100 is formed as shown in FIG. 2. The film 110 is formed, for example, by sputtering. After that, by providing the metal bumps 13, the semiconductor device 1 shown in FIG. 1 is completed.

As above, according to the first embodiment, the film 110 coats the sealing resin 91 and the ink 100. As a result, the ink 100 can be protected.

Colors of the surface of the film 110 are almost the same between in the region R1 where the ink 100 is provided and in the region R2 where the ink 100 is not provided. Nevertheless, reflection characteristics (reflectivities) of the surface of the film 110 are different between in the region R1 where the ink 100 is provided and in the region R2 where the ink 100 is not provided, and accordingly, recognizability for characters and the reading ability for bar codes can be improved.

Moreover, surface roughnesses of film 110 between in the region R1 where the ink 100 is provided and in the region R2 where the ink 100 is not provided are different. In the first embodiment, the surface roughness of the film 110 in the region R1 is smaller than the surface roughness of the film 110 in the region R2.

Moreover, light tends to undergo regular reflection on one of the regions R1 and R2, and light tends to undergo diffused reflection on the other. This leads to the difference between the reflectivities. The difference in reflectivity affects the recognizability for characters and the reading ability for bar codes. Accordingly, the difference in reflectivity of the film 110 between in the region R1 where the ink 100 is provided and in the region R2 where the ink 100 is not provided is preferably not less than 30%. In the first embodiment, the reflectivity of the film 110 in the region R1 is higher than the reflectivity of the film 110 in the region R2 by not less than 30%, the difference being still preferably not less than 40%.

For the first embodiment, there has been described the case where the color of the ink 100 (pigment 101) employs black, green, and white. However, the surface state of a face F100 after the ink 100 hardens, rather than the color of the ink 100, affects the surface state and the reflection characteristics of the face F110.

When the face F91 of the sealing resin 91 is a rough surface, components of the ink 100, such as the pigment 101, are selected such that a surface (face F100) of the ink 100 is smooth. Thereby, light undergoes regular reflection on the face F110 in the region R1 to some extent. Since the face F110 in the region R2 is in a rough, mat state, light undergoes diffused reflection on the face F110 in the region R2. As a result, the region R2 as a background is viewed to be dark, and the region R1 as the portion of the printed matters is viewed to be bright. By making a brightness difference between the region R1 and the region R2 large, the visibility for printed matters and the reading ability for bar codes can be improved.

An average particle size of the pigment 101 contained in the ink 100 is preferably not more than about 100 nm, for example. An example of the average particle size of carbon black used for the black ink is tens of nanometers.

A concentration of the pigment 101 contained in the ink 100 is preferably not more than 10%, still preferably not more than 5%. Moreover, the pigment 101 does not have to be contained in the ink 100. In other words, the concentration of the pigment 101 may be zero. In this case, the color of the ink 100 is colorless and transparent or is the base color of the component(s) other than the pigment 101.

The film 110 shown in FIG. 2 is a multilayer film. Nevertheless, the film 110 may be a single layer film.

Comparative Examples

Figure 9:
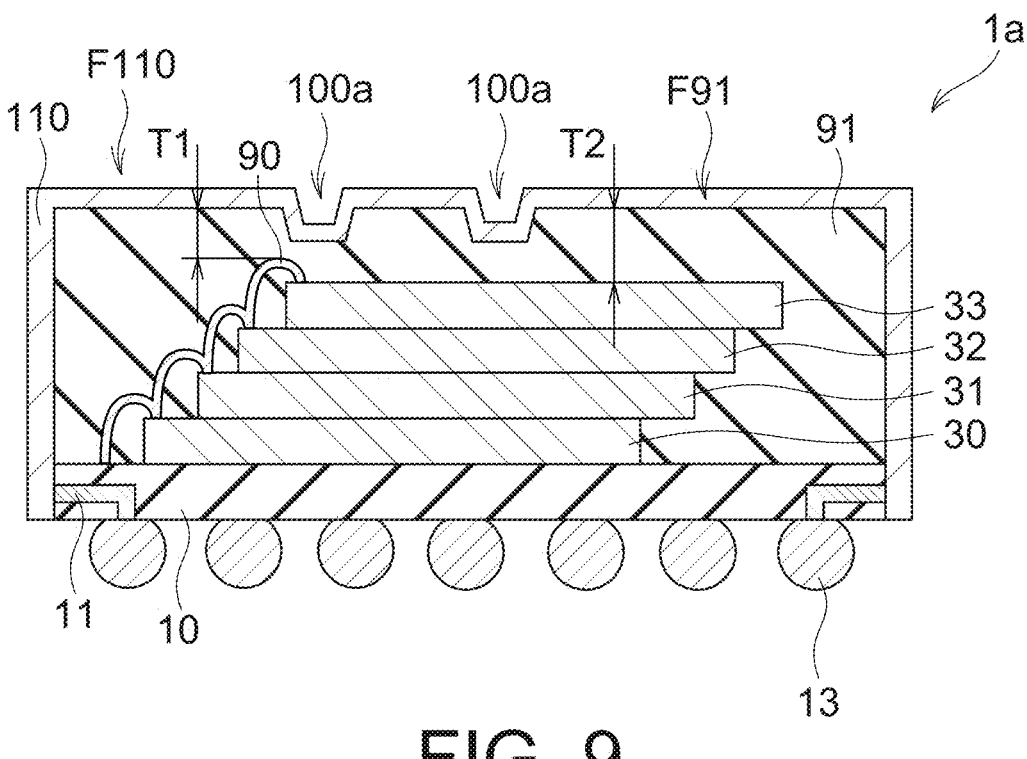
FIG. 9 is a cross sectional view showing an example of a configuration of a semiconductor device according to a first comparative example.

FIG. 9 is a cross sectional view showing an example of a configuration of a semiconductor device la according to a first comparative example. The first comparative example is different from the first embodiment in that a mark 100a is provided in place of the ink 100.

In the first comparative example, the mark 100a is a laser mark. In this case, the mark 100a is formed by scraping, melting, or the similar action on the package surface through irradiation with laser light.

Now, such a semiconductor package is requested to be made small and thin. In order to make it thin, one can think, for example, of making the wiring substrate 10 and the semiconductor chips 30 to 33 thin, and in addition, making the sealing resin 91 thin. However, to make the sealing resin 91 thin causes the sealing resin 91 that is on the semiconductor chips 30 to 33 and the sealing resin 91 that is on the bonding wire 90 to be thin. A thickness "T1", shown in FIG. 6, denotes a thickness of the sealing resin 91 that is on the bonding wire 90. A thickness "T2" denotes a thickness of the sealing resin 91 that is on the semiconductor chips 30 to 33. To make the thicknesses "T1" and "T2" small possibly causes the semiconductor chips 30 to 33 to be damaged with laser light having been transmitted through the sealing resin 91 and/or the bonding wires 90 and the semiconductor chips 30 to 33 to be exposed due to carving the sealing resin 91 with laser. In order to reduce the transmission of laser light and/or secure a margin of carving for the mark 100a, the thickness of the sealing resin 91 cannot be made thin down to the utmost limit.

Figure 10:
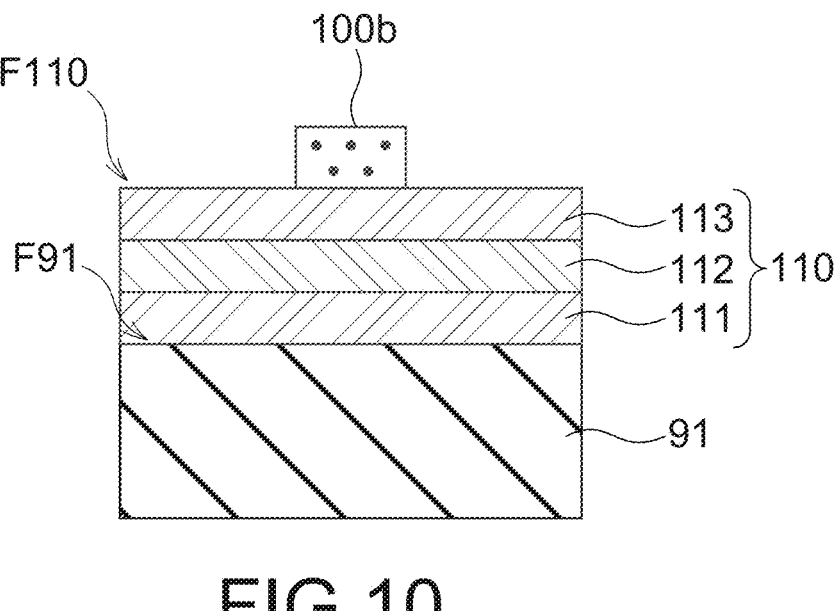
FIG. 10 is a cross sectional view showing an example of a configuration of ink and its periphery according to a second comparative example.

FIG. 10 is a cross sectional view showing an example of a configuration of an ink 100b and its periphery according to a second comparative example. The second comparative example is different from the first embodiment in that the ink 100b is provided on the film 110.

In the second comparative example, the ink 100b is an ink mark. The ink mark less affects the bonding wires 90 and the semiconductor chips 30 to 33 in the semiconductor package than a laser mark. Accordingly, the sealing resin 91 can be made thin using an ink mark, which readily enables the semiconductor package to be thin.

Nevertheless, the ink 100b possibly disappears or the printed matters suffer from defects or fade off due to an organic solvent, mechanical friction, or the like. Moreover, the ink 100*b* possibly discolors during a high temperature test. Moreover, there is a case where flame retardance is required for the outer surface of the semiconductor package, and it is occasionally difficult to make the ink 100*b* conformable to flame retardance.

To the contrary, in the first embodiment, after the ink 100 as an ink mark is formed for the semiconductor package, the film 110 is formed. Thereby, the ink 100 is coated by the film 110. As a result, the ink 100 can be protected against physical wearing, chemicals, oils, and the like. Moreover, since the ink 100 can be printed so as to have a small thickness, the degree of reduction in thickness of the sealing resin 91 is large with respect to the thickness of the ink 100, and the semiconductor package can be made thin as a whole. It is noted that the thickness of the ink 100 is not less than 4 μn, for example. Accordingly, as compared with the first comparative example and the second comparative example, the semiconductor package can be made thinner by making the sealing resin 91 thin and the ink 100 can be protected.

Moreover, since the ink 100 is not exposed on the package surface, discoloring of the ink 100 does not need to be considered. Moreover, since the ink 100 is coated by the noncombustible film 110 (metal film, for example), flame retardance of the ink 100 does not need to be considered.

Modification

A modification is different from the first embodiment in that the face F110 of the film 110 in the region R2 where the ink 100 is not provided has a mirror-finished surface.

The face F91 of the sealing resin 91 has a mirror-finished surface. The sealing resin 91 having the face F91 that has a mirror-finished surface can be formed, for example, by using, in the step shown in FIG. 8A, a release film having a mirror-finished surface. Thereby, the face F110 of the film 110 in the region R2 also has a mirror-finished surface.

With the modification, the success rate of reading in the case where the white ink is used is highest. The modification has a reverse tendency, to that with the first embodiment, in the relationship between the visibility or the success rate of reading and the type of the ink.

When the white ink is used, since the surface of the face F110 in the region R1 where the ink 100 (characters and bar codes) is provided is a rough surface, light undergoes diffused reflection on the region R1. Since the surface of the face F110 in the region R2 other than the region R1 has a mirror-finished surface, light undergoes regular reflection on the region R2 to some extent, so that the region R2 is viewed to be shiny. The region R2 as a background is viewed to be bright, the region R1 as the portion of the printed matters is viewed to be dark, and the brightness difference (gloss difference) between the region R1 and the region R2 is large. Accordingly, the visibility for printed matters is high.

With the modification, the surface roughness of the film 110 in the region R1 is larger than the surface roughness of the film 110 in the region R2

With the modification, the reflectivity of the film 110 in the region R1 is lower than the reflectivity of the film 110 in the region R2 by not less than 30%, preferably lower by not less than 40%.

When the face F91 of the sealing resin 91 has a mirror-finished surface, components of the ink 100, such as the pigment 101, are selected such that a surface (face F100) of the ink 100 is a rough surface. It is noted that the surface roughness of the face F110 may arise due to an additive or the like, not limited to the pigment 101, in the ink 100.

A larger average particle size of the pigment for the ink 100 is preferable. The average particle size of the pigment 101 contained in the ink 100 is not less than about 300 nm, for example. It is noted that an example of the average particle size of titanium(IV) oxide used for the white ink is about 300 nm.

A higher concentration of the pigment for the ink 100 is preferable.

Moreover, when the film 110 is thick, there is a possibility that recess portions of roughness on the surface of the ink 100 are filled with component substance(s) of the film 110 or that convex portions of the roughness on the surface of the ink 100 round due to attaching of component substance(s) of the film 110. In other words, there is a possibility that recess portions and convex portions of the roughness on the surface of the ink 100 become dull. Such dullness of the roughness on the surface of the ink 100 possibly results in reducing the difference in reflection of light on the face F110 between in the region R1 where the ink 100 is provided and in the region R2 where the ink 100 is not provided. This results in reducing the visibility for printed matters and the reading ability for bar codes. Accordingly, the film 110 is still preferably thin.

As in the modification, the face F110 of the film 110 in the region R2 where the ink 100 is not provided may have a mirror-finished surface. The ink 100 to be used may be modified in accordance with the surface state of the face F91 of the sealing resin 91.

The semiconductor device 1 according to the modification can attain the similar effects to those for the first embodiment.

Second Embodiment

Figure 11:
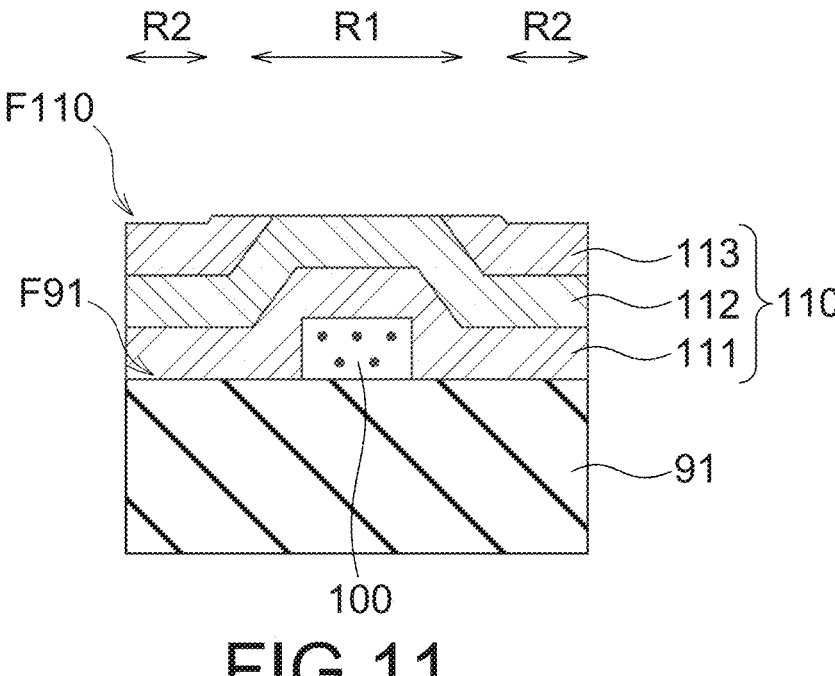
FIG. 11 is a cross sectional view showing an example of a configuration of ink and its periphery according to a second embodiment.

FIG. 11 is a cross sectional view showing an example of a configuration of ink 100 and its periphery according to a second embodiment. The second embodiment is different from the first embodiment in that the film 112 is exposed.

The film 113 is provided on the film 112. The film 113 has a different color from that of the film 112.

The film 112 is exposed from the film 113 in the region R1 where the ink 100 is provided. The film 112 is not exposed from the film 113 in the region R2 where the ink 100 is not provided.

The film 112 may have a blackish color through processing such as oxidation. This increases a brightness difference or a color difference between the film 112 and the film 113. Accordingly, identification ability for printed matters and the reading ability for bar codes can be improved.

As mentioned above, an example of the film 112 is copper, and an example of the film 113 is stainless steel, which is hardly oxidized.

With the second embodiment, the recognizability for characters and the reading ability for bar codes can be improved based on the color difference between the film 112 and the film 113.

The other configurations of the semiconductor device 1 according to the second embodiment are similar to the corresponding configurations of the semiconductor device 1 according to the first embodiment, and their detailed description is omitted.

Next, a manufacturing method of the film 110 is described.

After the ink 100 is provided (see FIG. 8B), the film 110 is formed as shown in FIG. 2. The formation of the film 110 is performed by sequentially forming the films 111, 112, and 113. Moreover, the forming the film 110 includes forming the film 112 coating the sealing resin 91 and the ink 100, and forming the film 113 coating the film 112 and having a different color from that of the film 112.

Next, as shown in FIG. 11, the film 113 in the region R1 where the ink 100 is provided is selectively removed. The removal of the film 113 may be performed, for example, by polishing the film 113 until the film 112 in the region R1 where the ink 100 is provided is exposed. Otherwise, the removal of the film 113 may be performed by etching using a mask, or may be performed by thin film removal using laser.

Next, processing of oxidizing the exposed film 112 is performed. An example of the oxidation processing is a thermal treatment.

As in the second embodiment, the visibility for printed matters and the reading ability for bar codes may be improved based on the color difference or the brightness difference between the plurality of films 112 and 113.

The semiconductor device 1 according to the second embodiment can attain the similar effects to those for the first embodiment.

Furthermore, depending on the surface state of the face F110 in the region R2, the exposed surface of the film 112 shown in FIG. 11 may be processed into a mirror-finished surface in order to increase the brightness difference between the film 112 and the film 113.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a resin layer;
ink provided on an upper surface of the resin layer; and
a conductive film coating the resin layer and the ink,
wherein the conductive film has a first region where the ink is provided and a second region where the ink is not provided, and a surface roughness of the conductive film in the first region is different from a surface roughness of the conductive film in the second region.

2. The semiconductor device according to claim 1, wherein the surface roughness of the conductive film in the first region is smaller than the surface roughness of the conductive film in the second region.

3. The semiconductor device according to claim 1, wherein a difference in skewness of the conductive film between in the first region where the ink is provided and in the second region where the ink is not provided is not less than 0.2.

4. The semiconductor device according to claim 1, wherein a difference in reflectivity of the conductive film between in the first region where the ink is provided and in the second region where the ink is not provided is not less than 30%.

5. The semiconductor device according to claim 1, wherein an average particle size of pigment contained in the ink is not more than 100 nm.

6. The semiconductor device according to claim 1, wherein an average particle size of pigment contained in the ink is not less than 300 nm.

7. The semiconductor device according to claim 1, wherein a concentration of pigment contained in the ink is not more than 10%.

8. The semiconductor device according to claim 1, wherein pigment is not contained in the ink.

9. A semiconductor device comprising:
a resin layer;
ink provided on an upper surface of the resin layer; and
a film coating the resin layer and the ink,
wherein the film has a first region where the ink is provided and a second region where the ink is not provided, and a surface roughness of the film in the first region is different from a surface roughness of the film in the second region,
wherein the film has a first film, and a second film provided on the first film and having a different color from that of the first film, and
wherein the first film is exposed from the second film in the first region where the ink is provided, and is not exposed from the second film in the second region where the ink is not provided.

10. The semiconductor device according to claim 1, wherein at least one of hardness, abrasion resistance, oil resistance, thermal resistance, and flame retardance of the conductive film is higher than that of the ink.

11. The semiconductor device according to claim 1, wherein the conductive film is a metal film.

12. The semiconductor device according to claim 1, wherein the conductive film includes stacked films which comprises:
a first metal film,
a second metal film provided on the first metal film, and
a third metal film provided on the second metal film, and
wherein the second metal film contains copper (Cu).

13. The semiconductor device according to claim 12, wherein:
the first metal film contains stainless steel, and
the third metal film contains stainless steel.

14. The semiconductor device according to claim 1, further comprising:
a wiring substrate that includes wiring, and
a semiconductor element provided on the wiring substrate,
wherein the resin layer seals a surface of the wiring substrate and the semiconductor element, and
wherein the wiring and the conductive film are electrically connected to each other.

15. The semiconductor device according to claim 1, wherein the ink contains carbon black.

16. The semiconductor device according to claim 9, wherein the first film and the second film are conductive films.

17. The semiconductor device according to claim 9, further comprising:
a wiring substrate that includes wiring, and
a semiconductor element provided on the wiring substrate,
wherein the resin layer seals a surface of the wiring substrate and the semiconductor element, and
wherein the wiring and the conductive film are electrically connected to each other.

18. The semiconductor device according to claim 16, wherein:
the first film contains copper (Cu), and
the second film contains stainless steel.

19. The semiconductor device according to claim 9, wherein the first film contains oxygen (O).

* * * * *